United States Patent [19]
Hamilton

[11] Patent Number: 5,673,730
[45] Date of Patent: Oct. 7, 1997

[54] FORM TOOLING AND METHOD OF FORMING SEMICONDUCTOR PACKAGE LEADS

[75] Inventor: Ernest J. Hamilton, Boise, Id.

[73] Assignee: Micron Technology, Inc., Boise, Id.

[21] Appl. No.: 590,773

[22] Filed: Jan. 24, 1996

[51] Int. Cl.$^6$ .................................................. B21D 37/01
[52] U.S. Cl. .................................................. 140/105; 72/462
[58] Field of Search .................................. 140/105, 147; 72/462

[56] References Cited

U.S. PATENT DOCUMENTS

| | | | |
|---|---|---|---|
| 4,553,420 | 11/1985 | Fierkens et al. | 140/105 |
| 5,375,320 | 12/1994 | Kinsman et al. | 29/827 |
| 5,387,447 | 2/1995 | Slutz et al. | 72/462 |

OTHER PUBLICATIONS

"Low-Pressure/High Pressure & Temperature Synthesis Diamond, Diamond–Like, and Related Materials Applications, Markets, and Funding Issues Worldwide," *Diamond Depositions, Science and Technology*, vol. 1, No. 2, Nov. (1990), pp.27–31.

Kimock et al., "Diamond–Like Carbon (DLC) Coating: Its Application for Polymeric Substrates," *Materials Research Society*, 1992, pp. 1–7.

Kimock et al., "Commercial Applications of Ion Beam Deposited Diamond–Like Carbon (DLC) Coatings," *Surface and Coatings Technology*, vol. 56, (1993) pp. 273–279.

Knapp et al., "Abrasion–Resistant Diamond–Like Carbon (DLC) Films for Optical Applications," *Presented at the 35th Annual Society of Vacuum Coaters Technical Conference*, Baltimore, Maryland, (1992), pp. 1–8.

Shing, "Films Composed of Diamond and Diamond–Like Carbon," *NASA Tech Brief*, Apr. (1995), vol. 19, No. 4, Item #51, pp. i, 1–2.

Pinneo, "Recent Articles," *Diamond Depositions: Science and Technology*, Nov. (1990), p. 17.

Tsai et al., "Characterization of diamondlike carbon films and their application as overcoats on thin–film media for magnetic recording," *J. Vac. Sci. Technol.* A5, 6, Nov./Dec. (1987), pp.3287–3312.

Anatech LTD, "Casidiam, Diamond–Like Carbon Coating" Product Literature, Non–dated.

*Primary Examiner*—Lowell A. Larson
*Attorney, Agent, or Firm*—Mueting, Raasch, Gebhardt & Schwappach, P.A.

[57] ABSTRACT

An improved forming tool for forming at least one lead of a semiconductor package includes a member having at least one surface. The at least one surface of the member has a first shape for forming the at least one lead of the semiconductor package to a shape corresponding to the first shape. The at least one surface includes a diamond-like carbon coating thereon. The semiconductor package lead forming method in accordance with the present invention includes providing a semiconductor package having at least one lead in a first shape. A diamond-like carbon coated surface is applied to the at least one lead in the first shape to form the at least one lead into a second shape.

20 Claims, 8 Drawing Sheets

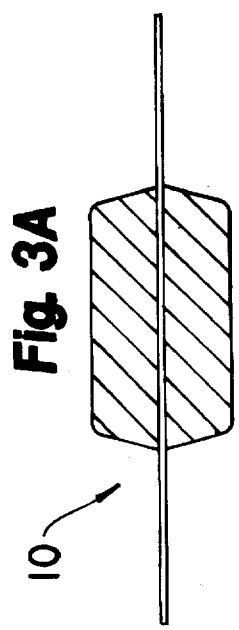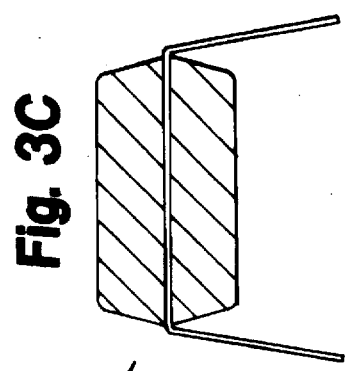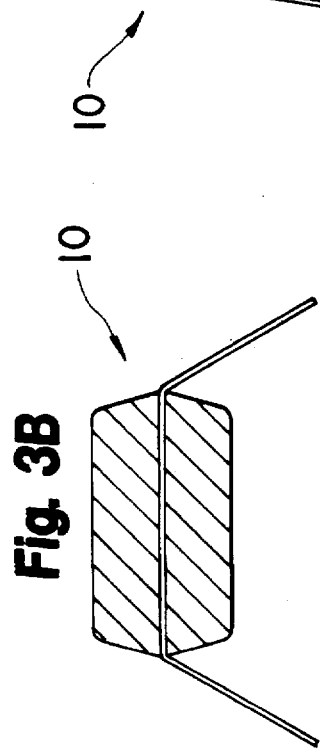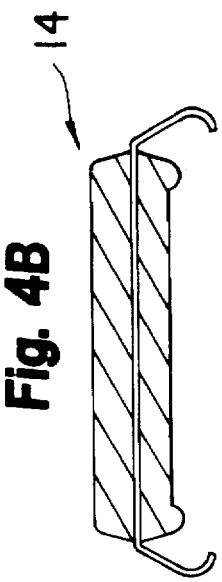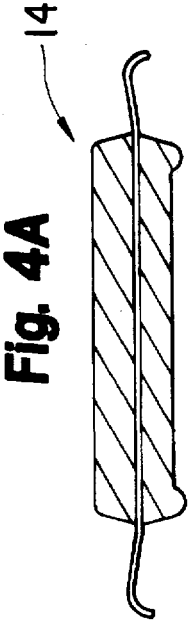

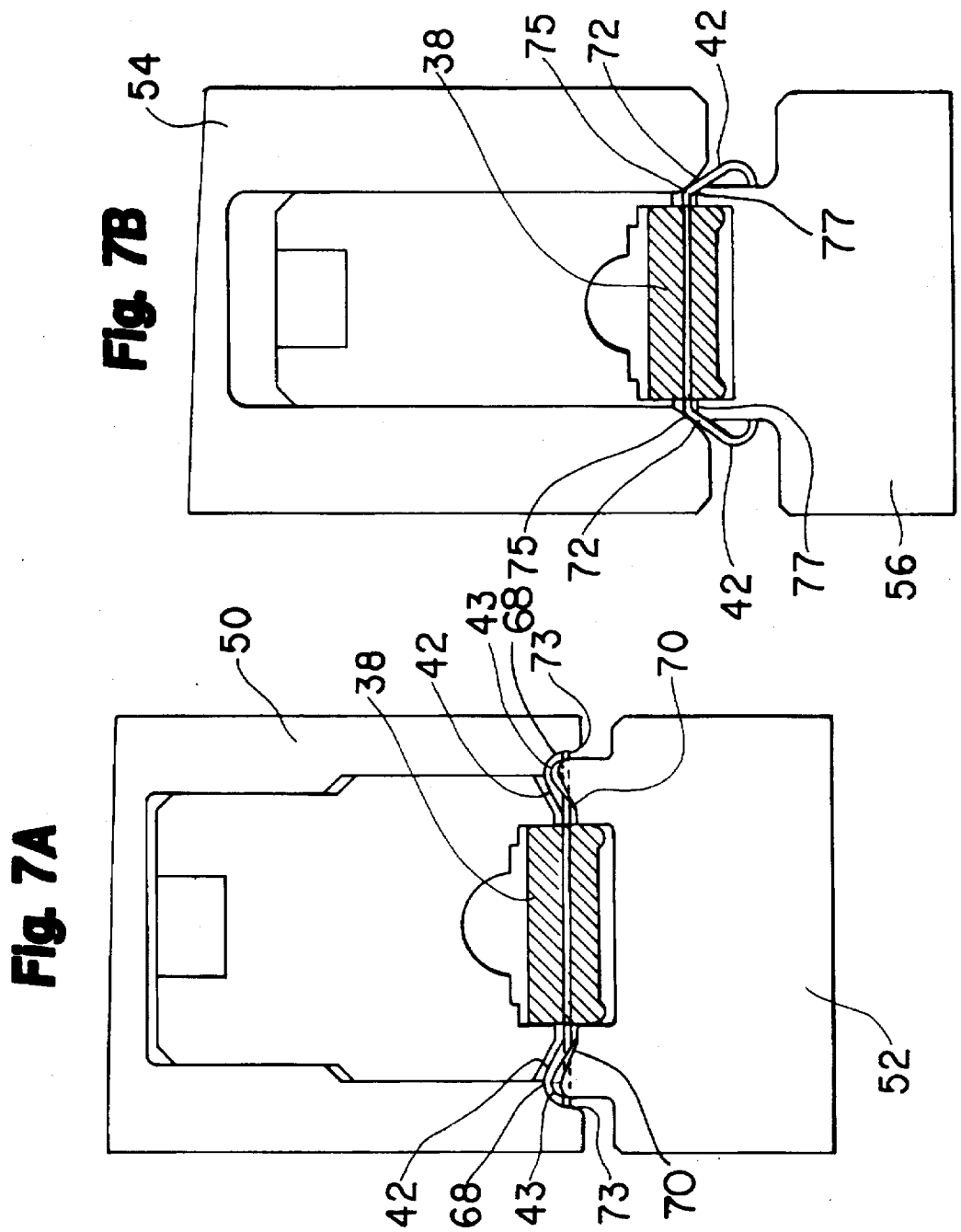

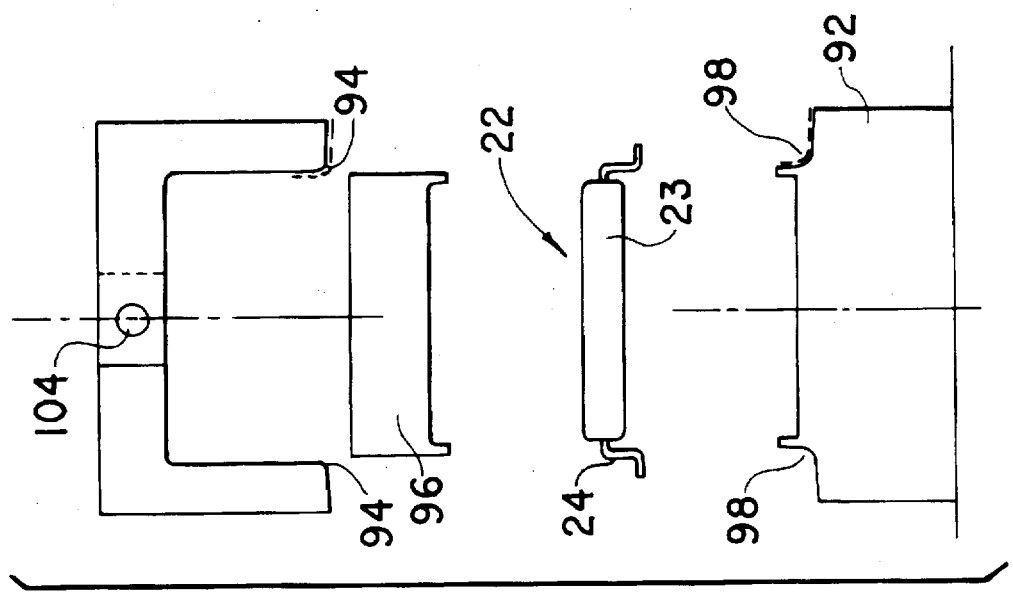
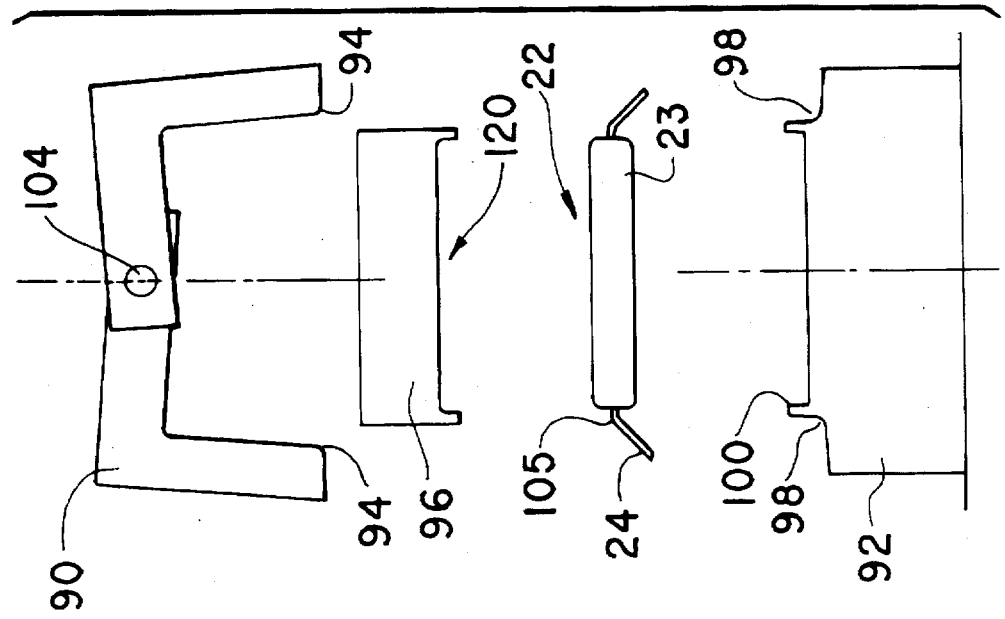

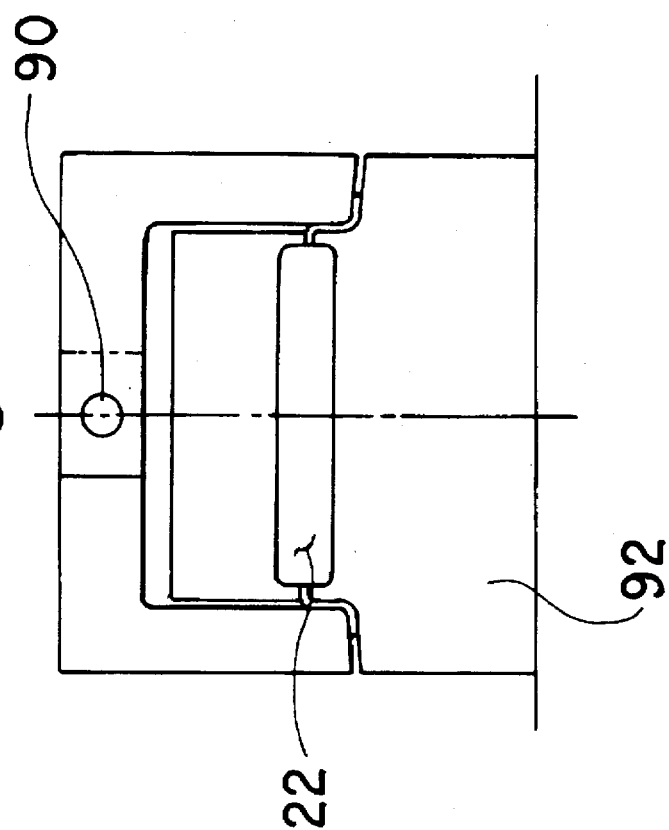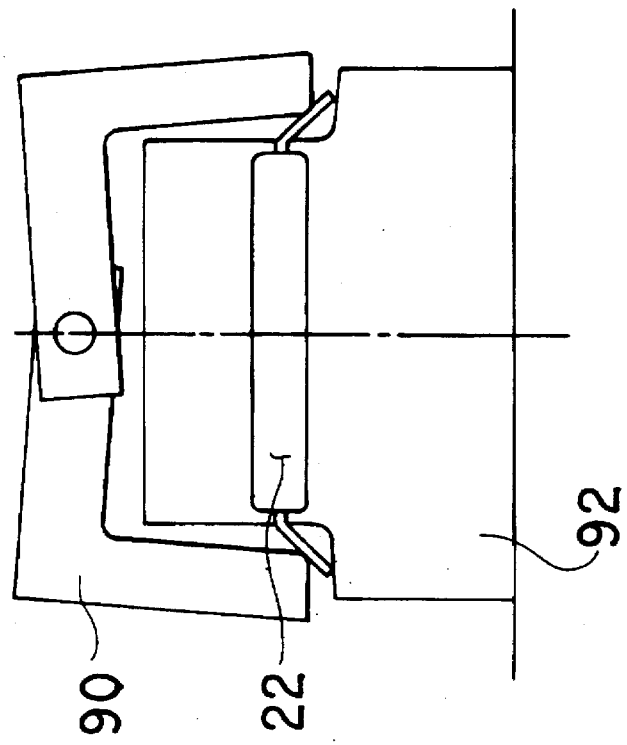

FORM TOOLING AND METHOD OF FORMING SEMICONDUCTOR PACKAGE LEADS

FIELD OF THE INVENTION

The present invention relates generally to the field of forming tools and methods of forming objects. More particularly, the present invention pertains to form tooling and methods of forming leads of semiconductor packages.

BACKGROUND OF THE INVENTION

Various types of semiconductor packages are utilized to provide a means of input/output to and from a semiconductor die mounted therein. The semiconductor packages usually include a main body portion and conductive leads. The body, usually manufactured using plastics or ceramics, protects the die encased inside the body from contact with objects, solvents, or other foreign objects that might physically damage or electrically damage circuitry about or on the die. Bond pads on the semiconductor die are coupled with leads which extend to the exterior of the main body of the semiconductor package.

Many different package types are manufactured and widely used. For example, dual in-line packages (DIPs) have two rows of leads which are normally inserted into holes in printed circuit boards. Single in-line packages (SIPs) have a single row of leads and also normally pass through holes in printed circuit boards when mounted. Surface mount packages are more easily handled by automated equipment and are mounted on the surface of printed circuit boards by means such as solder.

The leads of surface mount packages do not pass through holes in a printed circuit board. Most surface mount packages are either small outline J-Lead packages (SOJs) that have J-shaped formed leads or packages that utilize Gull Wing formed leads such as thin small outline packages (TSOPs). Other types of packages include bottom brazed flat packages as described in U.S. Pat. No. 5,375,320 entitled "Method of Forming "J" Leads on a Semiconditor Device," assigned to Micron Technology, Inc. and incorporated herein by reference thereto.

Further, chip carrier style packages are also utilized. Chip carriers may be leadless chip carriers (LCC) having conductive pads along edges thereof which may be soldered directly to a printed circuit board or in some circumstances leads are attached to the conductive pads and then formed for mounting on a printed circuit board. In addition, leaded chip carriers are also available which may, for example, be formed with J-leads or Gull Wing leads.

Packages, as previously described, are usually available with both plastic and ceramic bodies and often with the same lead styles, for example, J-lead or DIP-type leads. The manner in which the different lead types are formed on the ceramic and plastic bodies may differ. One reason for the difference in lead formation is that the plastic bodies usually use a lead frame for manufacturing the package, while ceramic packages often do not use lead frames. In plastic encapsulated bodies, the die is attached to the lead frame by an adhesive, bond pads of the die are connected to the lead frame by a method such as wire bonding, TAB bonding or other connecting method, and then the die and a portion of the leads are encapsulated in plastic. The remaining portion of the leads of the lead frame extend from the encapsulated body of the package providing input/output for the die.

In ceramic body packages, the leads are usually attached by brazing or otherwise bonding them to conductive pads on the surface of the ceramic body. The leads in such packages may be then formed to a desired lead configuration such as a J-lead. One such forming process for forming leads which have been attached to a body having conductive pads, for example, a brazed flat package, is shown in U.S. Pat. No. 5,375,320 entitled "Method of Forming "J" leads on a Semiconductor Device."

In manufacturing many of these packages, in particular the packages utilizing lead frames wherein the lead fingers of the lead frames extend from the encapsulated body of the package, various trimming and forming steps are utilized. The trimming steps are utilized to remove any unnecessary material away from the package such as flash or unwanted plastic exterior to the package. Further, the trimming steps may include cutting the leads extending from the encapsulated body to a desired length and shape. In most cases, the forming process is then performed after the trimming process. The forming process utilizes form tooling for forming the leads extending from the encapsulated body into the desired final form. For example, the leads may be formed by several forming tools into a J-lead for an SOJ package.

Various types of plating are used for plating the leads of the lead frames, and pieces of plating such as tin, lead, or palladium may adhere to and contaminate the forming surfaces during the forming process. These pieces of plating have a tendency to adhere to currently available form tooling made from various grades of tool steel or various grades of tungsten carbide.

As a result, form tool cleaning or replacement must be performed at frequent intervals in order to prevent damage to leads of the package as they are formed. For example, if the form tool has a piece of metal adhering thereto, the lead formed by the tool may be damaged. If the lead is damaged, the lead may not be adequate for soldering to a printed circuit board. These problems are especially apparent in automated equipment where the various steps are performed in close proximity to one another. Therefore, for the above reasons and others to be learned from the following description, there is a need in the art for a forming tool and a method of forming which improves upon the currently utilized tooling and processes for forming leads on a semiconductor package.

SUMMARY OF THE INVENTION

In accordance with the present invention, an improved forming tool for forming at least one lead of a semiconductor package includes a member having at least one surface. The at least one surface of the member has a first shape for forming the at least one lead of the semiconductor package to a shape controlled by the first shape. The at least one surface includes a diamond-like carbon coating thereon.

A package lead forming method in accordance with the present invention includes providing a semiconductor package having at least one lead in a first shape. A diamond-like carbon coated surface is applied to the at least one lead in the first shape to form the at least one lead into a second shape.

In various embodiments of the forming tool and the lead forming method, the diamond-like carbon coated surface may be adhesion resistant to metals such as lead, tin, palladium or other metals of similar characteristics and/or the diamond-like carbon coated surface may have a coefficient of friction when applied to one of steel, aluminum or the diamond-like carbon coating less than about 0.30.

BRIEF DESCRIPTION OF THE DRAWINGS

FIGS. 3A-3C; referred to collectively as FIG. 3, shows a standard flow in a dual in-line lead forming process; FIGS. 4A-4D, referred to collectively as FIG. 4, shows a standard flow in a small outline J-lead lead forming process;

FIGS. 7A-7D, collectively referred to as FIG. 7, show the form tooling utilized in accordance with the present invention to form J-leads for a small outline J-lead package;

FIG. 8A and 8B are exploded before and after views of form tooling utilized in accordance with the present invention to form gull wing leads for a small outline integrated circuit/small outline package and a thin small outline package; and FIG. 9A and 9B, are before and after illustrations of a forming step utilized in accordance with the present invention to form gull wing leads for a small outline integrated circuit/small outline package and a thin small outline package.

DESCRIPTION OF THE PREFERRED EMBODIMENT

Figure 1A:
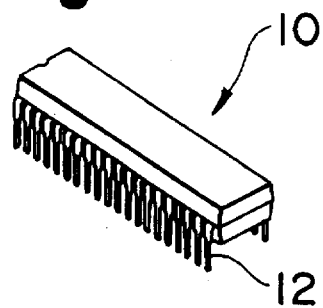
FIG. 1A shows a perspective view of a dual in-line package.
Figure 1B:
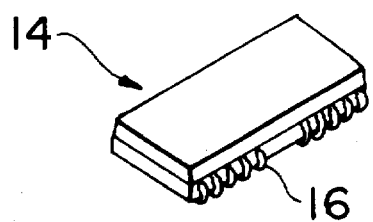
FIG. 1B shows a perspective view of small outline J-lead package having J-leads formed thereon.
Figure 1C:
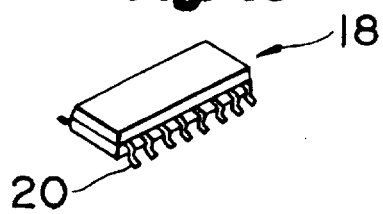
FIG. 1C shows a perspective view of a small outline integrated circuit or small outline package having gull wing leads formed thereon.
Figure 1D:
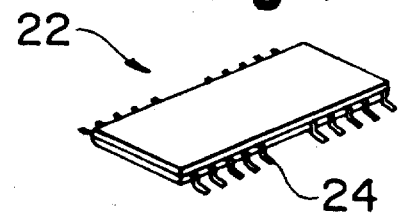
FIG. 1D shows a perspective view of a thin small outline package having gull wing leads formed thereon.

Leads of various semiconductor packages can be formed in accordance with the methods of the present invention and using forming tools in accordance with the present invention. Several illustrations of semiconductor packages are shown in the FIGS. 1A-1D. A perspective view of a dual in-line package (DIP) 10 is shown in FIG. 1A. The DIP package 10 includes DIP leads 12. FIG. 1B shows a perspective view of a small outline J-lead (SOJ) package 14 having J-leads 16. A small outline integrated circuit/small outline package (SOIC/SOP) 18 is shown in perspective view in FIG. 1C. The SOIC/SOP package 18 includes gull wing leads 20. FIG. 1D shows a perspective view of a thin small outline package (TSOP) 22 having gull wing leads 24 substantially similar to the gull wing leads of the SOIC/SOP package 18.

These packages are shown for illustrative purposes only and the types of packages to which the present invention is applicable are limited only by the accompanying claims. There are many other packages that could be formed with forming tools and lead forming methods in accordance with the present invention. Such leads may be on ceramic packages, plastic packages, flat packages, zigzag in-line packages (ZIPs), leaded chip carriers, leadless chip carriers with leads brazed to conductive pads thereof, diode packages, heat sinks or any other package that requires leads to be formed. Reference to semiconductor packages includes integrated circuit packages as well as other device packages including but not limited to resistor, capacitor, hybrid, multi-chip packages, diode, transistor packages, etc.

Figure 2A:
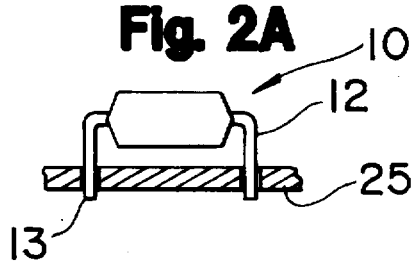
FIG. 2A shows a dual in-line package mounted through a printed circuit board.
Figure 2B:
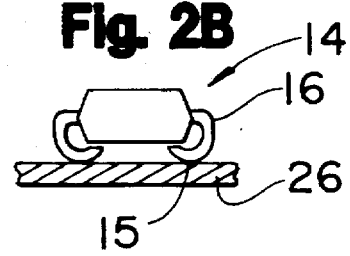
FIG. 2B shows a small outline J-lead package mounted on a printed circuit board.
Figure 2C:
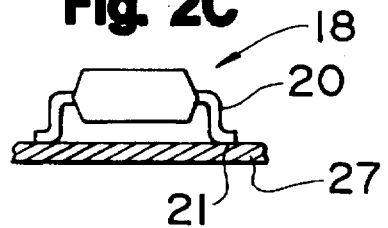
FIG. 2C shows a small outline integrated circuit or small outline package mounted on a printed circuit board.
Figure 2D:
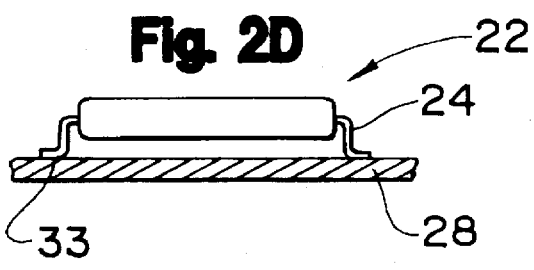
FIG. 2D shows a thin small outline package mounted on a printed circuit board.

FIGS. 2A-2D show views of each of the semiconductor packages shown in FIGS. 1A-1D as mounted with respect to a printed circuit board. FIG. 2A shows the DIP package 10 having the DIP leads 12 mounted through holes in printed circuit board 25. The J-leads 16 of the SOJ package 14 are mounted on the printed circuit board 26 as shown in FIG. 2B. Further, the SOIC/SOP package 18 is shown with its gull wing leads 12 mounted on printed circuit board 27 in FIG. 2C and the TSOP package 22 is shown in FIG. 2D with its gull wing leads 24 mounted on printed circuit board 28.

With respect to each of the leads of the various packages, a certain portion of each lead is soldered or otherwise conductively connected to metalization on the printed circuit board. The leads usually are plated with a metal such as tin, lead, tin-lead, palladium, etc. to provide, for example, corrosion protection and to enhance solderability. It is important during the lead forming process that the lead being formed is not damaged such that solderability is degraded and the possibility of corrosion exists. It is especially important therefore, that the lead portion at the seating plane of the lead on the printed circuit board be free from damage. For example, the SOJ package 14 is mounted to the printed circuit board 26 at reference number 15. As such, it is important that the forming tool which forms the lead at the reference number 15 not damage or gall the lead at this point. The same circumstances apply to the forming tools used to form the portions of the leads of the other packages which are soldered to the printed circuit boards such as the lead portions at reference number 13 of FIG. 2A, reference number 21 of FIG. 2C and reference number 33 of FIG. 2D.

FIGS. 3A-3C show the various forms of the DIP leads of a DIP package 10 through steps of a DIP lead forming process. FIG. 3A shows the leads in their initial state. FIG. 3B shows the leads in a preform state and FIG. 3C shows the leads in a final state. Although DIP package leads are not always formed with dies as are many other leads, they can be formed in such a manner. Therefore, the present invention which uses a diamond-like carbon coated surface to form the leads or at least a portion of the leads can be used in the forming of DIP leads.

Figure 4D:
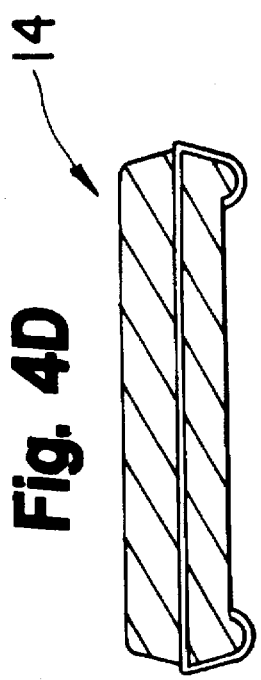
Figure 4C:
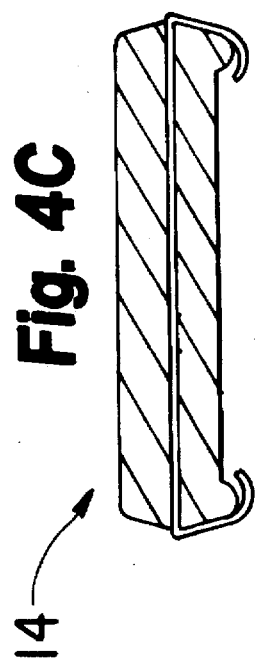

FIGS. 4A-4D show a plurality of configurations of the J-leads of SOJ packages 14 as the leads are formed in the SOJ lead forming process. FIG. 4A shows the leads after a lead tip curl step is performed. FIG. 4B shows the form of the leads after a second forming step is completed. The form of the leads after a third forming step are shown in FIG. 4C and a final form of the leads after a final forming step is shown in FIG. 4D. The forming tools for performing each of these steps shall be described further below with reference to FIG. 7 as the lead forming method is described.

Figure 5B:
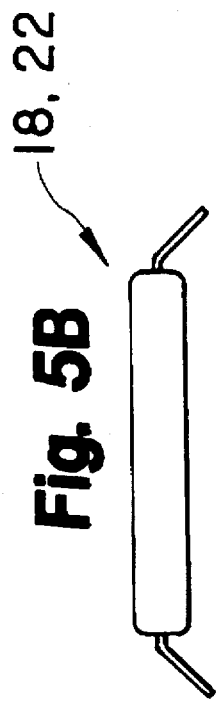
FIGS. 5A-5C, referred to collectively as FIG. 5, shows a standard flow in a small outline integrated circuit/small outline package and thin small outline package gull wing lead forming process.
Figure 5A:
Figure 5C:
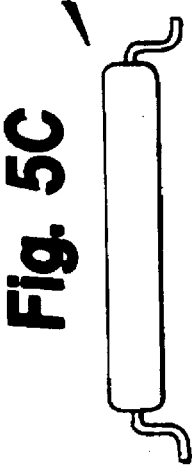

FIG. 5A-5C generally shows a plurality of configurations of gull wing leads of a package such as the SOIC/SOP package 18 or the TSOP package 22 as the leads are formed in the lead forming process. The lead forming process for the gull wing leads of the SOIC/SOP package and TSOP package are similar so they are treated together with respect the FIG. 5 and also in the description of the forming method with reference to FIGS. 8 and 9. The leads are shown in FIG. 5A in their initial state. FIG. 5B shows the form of the leads after a first forming step which may be completed with the cutting step as described further below. The gull wing leads are shown in FIG. 5C after the gull wing forming step. The forming tools for performing each of these steps shall be described further below with reference to FIG. 8 and 9 as the gull wing lead forming method is described.

The method of forming J-leads of the SOJ package shall be described with reference to FIGS. 6 and 7A–7D. As discussed previously in the Background of the Invention section, a semiconductor die is attached to a lead frame by an adhesive as is known to one skilled in the art. The lead frame is a thin metal strip which can be connected to several semiconductor dice. The lead frame and devices are an integral unit when the semiconductor package is being manufactured. Gradually, as the semiconductor packages are process through the trimming and forming processes to create the packaged semiconductor with formed leads thereon, the semiconductor packages are separated from the lead frame.

Figure 6:
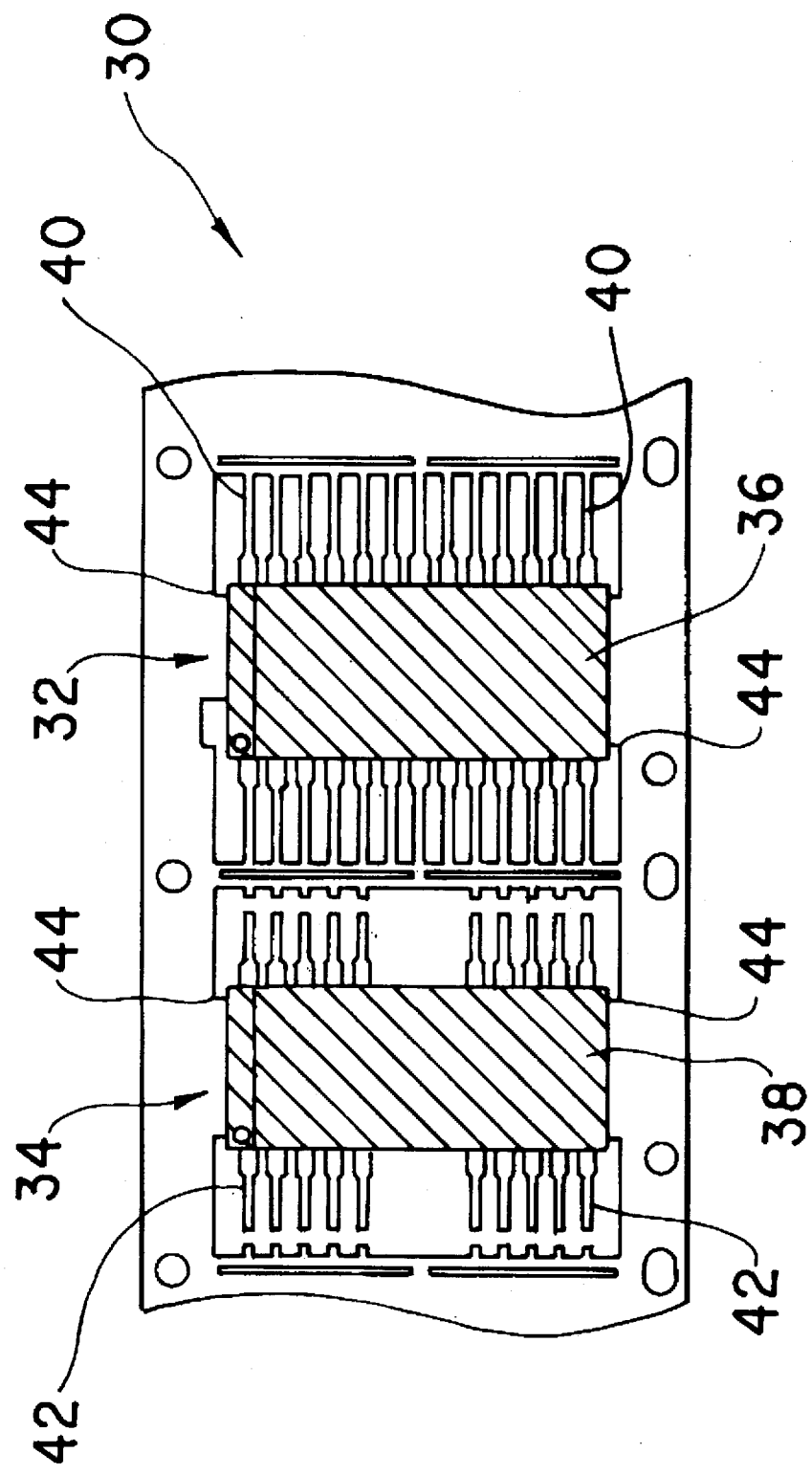
FIG. 6 is a general diagram representative of a small outline J-lead package illustrating lead length cut in the process of producing the package.

After the semiconductor die is attached physically to the lead frame, bond pads of the semiconductor die are connected to the lead frame by a method such as wire bonding, TAB bonding or other connecting method known to those skilled in the art. A portion of a lead frame 30 is shown in FIG. 6. The lead frame 30 illustrates two semiconductor packages 32, 34 which have already been encapsulated as is known to one skilled in the art. The encapsulation forms the main body portions 36, 38 of the semiconductor packages 32, 34, respectively. The die bonded to the lead frame is encapsulated with a portion of the leads. The remaining portion of the leads 40, 42 of the lead frame 30 extend from the encapsulated main body of the semiconductor package electrically connecting the outside of the package to the semiconductor die mounted inside. As shown in FIG. 6, the leads 40 of semiconductor package 32 are in the uncut state. The leads 42 of the semiconductor package 34 have been trimmed or cut to a desired lead length for the package using a shearing technique. Prior to lead cutting, other portions of the lead frame have been removed. The semiconductor packages with cut leads are anchored to the lead frame for further processing by metal portions 44.

The process of forming the cut leads 42 is then performed. The process of forming or bending the leads in a package to a specified configuration utilizes a method of contacting the leads between two pieces of form tooling called a punch and die which are made to a shape for forming a desired bend in the lead. The punches and dies for forming the J-leads in accordance with the present invention are shown in FIGS. 7A–7D.

Figure 7C:
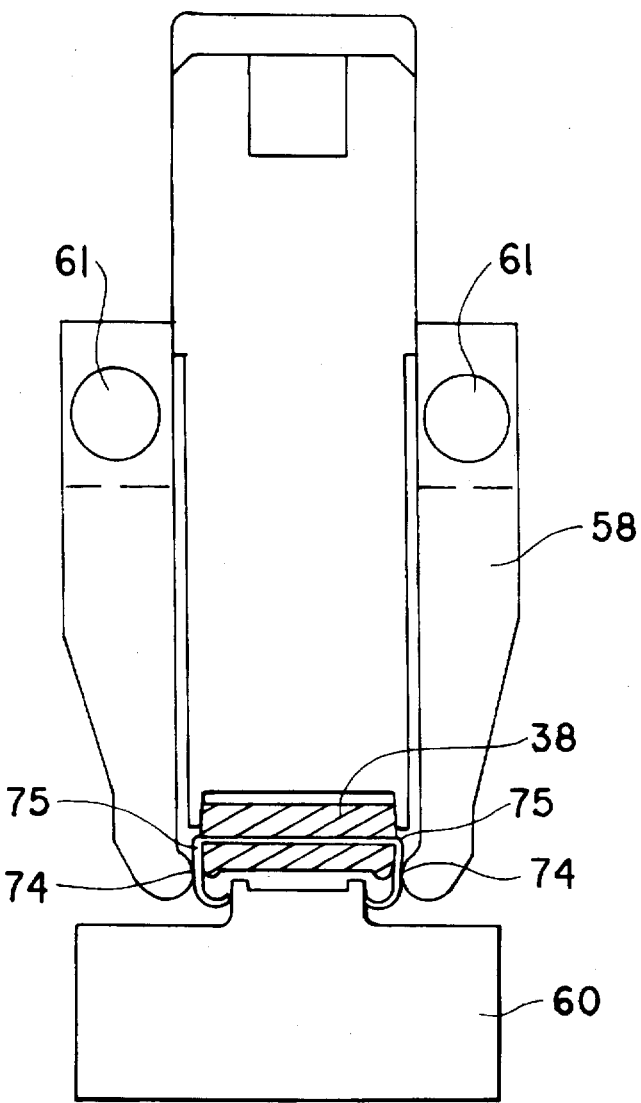

FIG. 7A shows the punch 50 and die 52 for forming the lead tip curl configuration of the J-lead as shown in FIG. 4A. FIG. 7B shows the punch 54 and die 56 for performing the second form configuration of the J-lead as shown in FIG. 4B. A pivot punch 58 and die 60 for forming the J-lead into the lead form of FIG. 4C is shown in FIG. 7C. The final form step to obtain the J-lead final configuration as shown in FIG. 4D is performed with the die 62 and punch 64 of FIG. 7D.

The lead tip curl forming step as shown in FIG. 7A is performed to form an arc 43 at the end of lead 42. The arc is accomplished by punch 50 contacting the lead at surface 68 and then bending the lead 42 over surface 70 of die 52. The punch 50 has a leading radius 73 to permit gradual bending of the lead into the arc without galling or scraping the leads.

The second forming step as shown in FIG. 7B is performed to form a shoulder 75 in the leads 42 at about the same position as, or a little wider than, is required for the final position of the J-bend shoulder. The shoulder 75 is formed by punch 54 having a surface 72 machined at an angle such as about 55° from horizontal. The punch 54 drops over the die 56 which has a small radius surface 77 for the shoulder 75 to form over. At the closed position of the punch 54 and die 56, there remains a gap therebetween in the vicinity of the lead's shoulder 75 so that the lead 42 is not over stressed and plating material is not scraped off of the leads 42.

The third forming step as shown in FIG. 7C is performed to bend the lead 42 so that a portion of the lead is vertical along side of the main body and the remainder of end of the lead is folded under the main body toward the bottom thereof. The bend is performed by pivot punch 58 pivotable at pivots 61. The punch 58 has surfaces 74 for contact with the lead 42 to force the end of the lead 42 toward the main body.

Figure 7D:
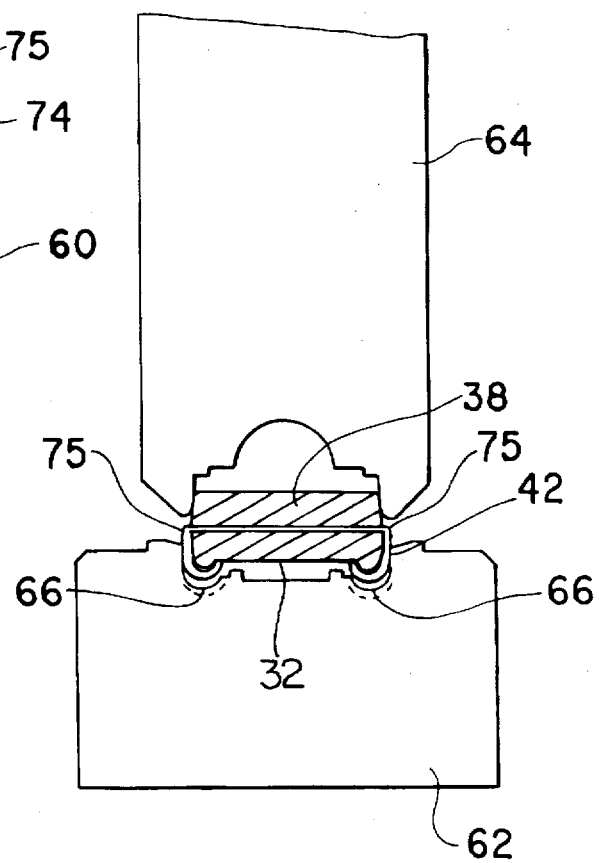

The die 62 and punch 64 for performing the final forming step of the SOJ leads as shown in FIG. 7D bends the leads 42 toward the bottom of the semiconductor package 32 and further curves the ends of the leads toward the bottom of the package. The package is given its final form by locating the package 34 in line with the punch 64 and die 62, as is the case in any of the preceding forming steps, while the final form punch 64 drops down onto the package to form the leads 42 in the die 62.

The die 62 includes two surfaces or grooves 66 of the same radius as is required for the final shape of the J-leads. The two surfaces 66 are diamond-like carbon coated surfaces applied to tooling form material such as various grades of tool steel, various grades of tungsten carbide, or any other forming material known to one skilled in the art which may be used to form punches or dies. Several materials used include D2 tool steel, CD-6N carbide (a 6% nickel binder grade carbide) available from Carbide having a place of business in Irwin, Pa., or a C-18 carbide which is available from Basic Carbide of Buena Vista, Pa.

The diamond-like carbon coated surfaces, generally shown by dashed line, prevent the adhesion of lead, tin, palladium or other similar metals to the forming surface and are extremely slick and durable. One diamond-like carbon coating applied to the forming tool to create the diamond-like carbon coated surface is a coating available through Anatech, Ltd. having a place of business at Springfield, Va. This coating applied through Anatech, Ltd. to create the coated surface is the Casidiam™ Diamond-Like Carbon Coating. Casidiam™ is a trademark assigned to Anatech, Ltd. The surface may be prepared for coating by polishing, thorough degreasing, and bead blasting. The carbide is cleaned effectively by bead blasting.

The Casidiam™ coating has a composition of carbon, hydrogen and doping elements with a structure of a mixture of $Sp^3$ (tetrahedral diamond bonds) and $sp^2$ (trigonal graphitic bonds). The density of the coating is in the range of about 1.8–2.1 gm/cm$^3$ and the coating has hardness in the range of about 2000 Kg/mm$^2$ to about 5000 Kg/mm$^2$ against load on a Fischer hardness tester. The hardness of the coating in accordance with the present invention would preferably be as hard as a quartz filler in the encapsulant trimmed from the package which normally falls within the above-mentioned range. However, softer coatings below the above-mentioned range are also beneficial for preventing damage to the plated leads as they are formed. The Vickers hardness may be as low as about 1000 Kg/mm$^2$ and still provide benefit. Further, the Vickers hardness may be greater than the 2000 to about 5000 Kg/mm$^2$ range.

The coefficient of friction of the Casidiam™ coating and in accordance with the present invention is in the range of about 0.02 to about 0.30 as applied to aluminum, steel, or upon itself. Preferably, the coefficient of friction should be as low as possible and less than about 0.20. The low coefficient of friction reduces the wearing of the forming tool, but more importantly reduces the adhesion of metals such as, for example, the plating metals lead, tin, tin-lead and palladium. The reduced adhesion allows the tool to form the final form of the J-lead without plating materials adhered thereto. This, in turn, reduces the likelihood of the portion of J-lead which is soldered to the printed circuit board when the semiconductor package is mounted from being damaged and degraded for solderability during the forming process. The relative humidity during the process should be kept low, such as below 75% and preferably below 50% to improve the coefficient of sliding friction.

The coated surface should preferably have an electrical resistivity of less than about $10^8$ ohms/cm to dissipate any static for protection of the semiconductor die. The electrical resistivity of the Casidiam™ coating is in the range of about $10^5$ to about $10^{12}$ ohms/cm.

Other characteristics of the Casidiam™ coating include a general inertness to acids, alkalis, solvents, salts, and water to prevent damage to the tooling such as rust. It forms a barrier to hydrogen and other gases and has a thermal conductivity of greater than about 400 W/mK. The dielectric constant of the coating is about 11 at 10 kHz to about 4 at 10 MHz. Further, the range of optical transparency of the Casidiam™ coating is about 2 to about 50 μm and the refractive index of the coating is in the range of about 1.8 to about 2.3.

The method of forming leads 24 of the TSOP package 22 shall be described with reference to FIGS. 8A and 8B and FIGS. 9A and 9B. As discussed previously with respect to the forming of the J-leads of the SOJ package, the same general process of attaching the semiconductor die to a lead frame by an adhesive, electrically connecting the bond pads of the semiconductor die to the lead frame, and encapsulating the die connected to the lead frame and portions of the lead frame to form the main body portion 23 of the TSOP package 22 may be utilized for making the TSOP package. In addition, a molded carrier ring as opposed to the lead frame may be utilized as is known to one skilled in the art. The remaining portion of the leads 24 of the lead frame extend from the encapsulated main body 23 of the semiconductor package 22 electrically connecting the outside of the package to the semiconductor die mounted inside.

The leads 24 of the semiconductor package 22 are cut or trimmed to a desired lead length for the package using a sheafing technique. Prior to lead cutting, other portions of the lead frame may be trimmed or removed. The semiconductor packages with cut leads are still anchored to the lead frame or molded carrier ring for further processing such as the lead forming process described below. This same general process is equally applicable to the SOIC/SOP package.

In the lead curing step, the leads 24 may be formed into a first configuration with a shoulder bend 105 as shown in FIG. 8A. The shoulder bend 105 may be accomplished by dies and punches during this curing step or may be accomplished in a separate step using a punch and die configuration similar to the punch and die configuration used to form the shoulder bend for the SOJ device.

With the TSOP package having leads as configured in FIG. 8A and also as shown in FIG. 5B, a pivot form punch 90 is used to perform the forming step that results in the gull wing shape lead as shown in FIG. 8B and FIG. 5C. The package 22 is located in the forming process by projections 100 of pivot form die 92. The projections 100 have a radius for maintaining the shoulder bend 105 in the lead 24. With the package 22 located on the pivot form die 92, a pressure pad 96 having an opening 102 for accepting the main body 23 of the package 23 is positioned for protecting and reducing the pressure on the thin package. The pivot form punch 90 being of two members connected by a pivot 104, is then dropped down onto the leads 24. The pivot form punch 90 includes a surface 94 having a radius to reduce galling and scraping of the plating on the leads as the gull wing bend of the lead is formed. The surfaces 94 are brought down into the leads perpendicular thereto or at about a 45° angle. The lead 42 is forced into contact with surface 98 of the pivot form die 92 to form the lead 24. Although this may be considered the final forming process, an additional forming process could be utilized to provide tighter tolerances for the leads.

An alternate punch to the pivot punch may include a non-pivoting punch mounted with a radial surface shaped for contact with the lead to force the lead into the die form 92. The radial surface would also be a diamond-like carbon coated surface. The contact point of the radial surface on the lead would be substantially the same as the contact point of surface 94 on the lead.

The surfaces 94 of the pivot form punch 90 and the surfaces 92 of the pivot form 98 are diamond-like carbon coated surfaces just as described above with respect to the surfaces 66 for forming the J-leads of the SOJ package. The surfaces coated are generally shown by the dashed portions in FIG. 8B. This coating prevents the adhesion of lead, tin, palladium or other similar metals to the forming surface and are extremely slick and durable. A diamond-like carbon coating that can be applied to form the coated surfaces is a coating applied through Anatech, Ltd. having a place of business at Springfield, Va. The coating applied through Anatech, Ltd. is the Casidiam™ Diamond-Like Carbon Coating.

Just as additional forming steps can be utilized to form tighter tolerances for the TSOP package leads, any number of forming steps may be utilized to form the leads. For example, a three step process is used to form the J-leads of a ceramic flat package as described in U.S. Pat. No. 5,375, 320 entitled "Method of Forming "J" Leads on a Semiconductor Device" which is hereby incorporated by reference. Further, for example, a one step process may be utilized for forming the TSOP package leads and even may be performed at the same time as the leads are cut. Therefore, it should be readily apparent to one skilled in the art that the present invention is not limited to the semiconductor lead forming process being performed in any particular number of steps.

In addition, the present invention is applicable to any package that requires forming of the leads. This includes ceramic packages, flat packages, plastic packages, DIP packages, ZIP packages, thin quad flat packs (TQFPs), and any other packages that require leads to be formed with form tooling like that described herein even though the configuration of the form tooling may be substantially different depending on the bends required for forming the particular leads.

Moreover, any surface of the punches or dies to form the leads of various packages may be diamond-like carbon coated surfaces as described herein. For example, in the forming of the J-leads it may beneficial to have diamondlike carbon coated surfaces at surfaces 73 of FIG. 7A, surfaces 72 of FIG. 7B, and surfaces 74 of FIG. 7C. Substantial benefit is obtained when the coated surface is at the location where the lead is to be connected or soldered to the printed circuit board such as the forming surfaces 66, 94 and 98. Further, such coating is also very beneficial in locations where there is some sliding motion between the forming surface and the plated lead. For example, such surfaces may include 72 of FIG. 7, surface 66 of FIG. 7D and surface 94 of FIG. 8B.

Although the invention has been described with particular reference to a preferred embodiment thereof, variations and modifications of the present invention can be made within a contemplated scope of the following claims as is readily known to one skilled in the art.

What is claimed is:

1. A lead forming tool for forming at least one lead of a semiconductor package, the lead forming tool comprising: a member having at least one surface, the at least one surface having a first shape for forming the at least one lead having a second shape to a shape controlled by the first shape, the at least one surface including a diamond-like carbon coating thereon.

2. The lead forming tool according to claim 1, wherein the at least one surface of the member is a bend surface for providing one of a plurality of bends in the at least one lead of the semiconductor package.

3. The lead forming tool according to claim 2, wherein the semiconductor package is a small outline package including One of a J-lead package and a gull wing package and further wherein the bend surface is of the shape for providing a final form bend in the at least one lead of the small outline package.

4. The lead forming tool according to claim 1, wherein the diamond-like carbon coating is adhesion resistant to metals.

5. The lead forming tool according to claim 4, wherein the diamond-like carbon coating is adhesion resistant to one of lead, tin, palladium or other metals of similar characteristics.

6. The lead forming tool according to claim 1, wherein the diamond-like carbon coating has a Vickers hardness greater than about 1000 Kg/mm².

7. The lead forming tool according to claim 1, wherein the diamond-like carbon coating has a coefficient of friction when applied to one of steel, aluminum or the diamond-like carbon coating below about 0.30.

8. A lead forming tool for forming at least one lead of a semiconductor package, the semiconductor package is a small outline J-lead package having a bottom surface, the lead forming tool comprising:

a member having at least one surface, the at least one surface including a bend surface of a first shape for forming the at least one lead having a second shape to a shape controlled by the first shape, wherein the first shape of the bend surface of the member is of a shape for bending the at least one lead toward the bottom surface of the small outline J-lead package, the bend surface including a diamond-like carbon coating thereon.

9. A lead forming tool for forming at least one lead of a semiconductor package, the semiconductor package having a top surface, the lead forming tool comprising:

a member having at least one surface, the at least one surface having a first shape for forming the at least one lead having a second shape to a shave controlled at least in part by the first shape, the at least one surface including a diamond-like carbon coating thereon; and an additional member having an additional diamond-like carbon coated surface of an additional shape corresponding to the first shape such that when the at least one surface and the additional surface are applied together to the at least one lead, the at least one lead is formed to a shape controlled by the first shape and the additional shape, the at least one lead formed including a portion which is substantially vertical to the top surface of the semiconductor package and a portion which is substantially parallel to the top surface of the semiconductor package.

10. A semiconductor package lead forming method, the method comprising the steps of:

providing a semiconductor package having at least one lead in a first shape; and applying a diamond-like carbon coated surface to the at least one lead in the first shape to form the at least one lead into a second shape.

11. The method according to claim 10, wherein the application step includes the step of applying additional diamond-like carbon coated surfaces to the at least one lead, each surface for forming the at least one lead into one of a plurality of shapes to step-wise form the at least one lead of the semiconductor package into a final shape.

12. The method according to claim 10, wherein the semiconductor package is a small outline package including one of a J-lead package and a gull wing lead package and further wherein the application step includes applying the diamond-like carbon coated surface to form the at least one lead into a final shape.

13. The method according to claim 12, wherein the final shape and the second shape are the same.

14. The method according to claim 10, wherein the diamond-like carbon coated surface is adhesion resistant to metals.

15. The method according to claim 14, wherein the diamond-like carbon coated surface is adhesion resistant to one of lead, tin, palladium or other metals of similar characteristics.

16. The method according to claim 10, wherein the diamond-like carbon coated surface has a Vickers hardness greater than about 1000 Kg/mm².

17. The method according to claim 10, wherein the diamond-like carbon coated surface has a coefficient of friction when applied to one of steel, aluminum or the diamond-like carbon coating in a range below about 0.30.

18. A semiconductor package lead forming method, the method comprising the steps of:

providing a J-lead semiconductor package having a bottom surface and having at least one lead in a first shape; and applying a diamond-like carbon coated surface to the at least one lead to bend the at least one lead toward the bottom surface of the J-lead semiconductor package.

19. A semiconductor package lead forming method, the method comprising the steps of:

providing a semiconductor package having at least one lead in a first shape;

applying a diamond-like carbon coated surface to the at least one lead in the first shape to form the at least one lead into a second shape: and applying an additional diamond-like carbon coated surface to the at least one lead simultaneously with the other diamond-like carbon coated surface to form the at least one lead into the second shape.

20. The method according to claim 19, wherein the at least one lead formed into the second shape is a gull wing lead for the semiconductor package.

* * * * *

UNITED STATES PATENT AND TRADEMARK OFFICE
CERTIFICATE OF CORRECTION

PATENT NO.: 5,673,730
DATED: October 7, 1997
INVENTOR(S): Ernest J. Hamilton

It is certified that error appears in the above-identified patent and that said Letters Patent is hereby corrected as shown below:

Col. 3, lines 18-19, start a new paragraph with "Figs. 4A-4D";

Col. 6, line 54, delete "$Sp^3$" and insert --$sp^3$--;

Col. 9, line 29, delete "One" and insert --one--; and

Col. 9, line 63, delete "shave" and insert --shape--.

Signed and Sealed this

Seventeenth Day of November, 1998

BRUCE LEHMAN

Attest:

Attesting Officer

Commissioner of Patents and Trademarks